(12) United States Patent
Shan

(10) Patent No.: US 11,044,824 B2
(45) Date of Patent: Jun. 22, 2021

(54) CONNECTION STRUCTURE AND DISPLAY APPARATUS

(71) Applicant: HKC Corporation Limited, Shenzhen (CN)

(72) Inventor: Jianfeng Shan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 17 days.

(21) Appl. No.: 16/342,119

(22) PCT Filed: Oct. 12, 2018

(86) PCT No.: PCT/CN2018/109960
§ 371 (c)(1),
(2) Date: Apr. 15, 2019

(87) PCT Pub. No.: WO2019/072224
PCT Pub. Date: Apr. 18, 2019

(65) Prior Publication Data
US 2020/0146162 A1 May 7, 2020

(30) Foreign Application Priority Data
Oct. 12, 2017 (CN) .......................... 201710948083.0

(51) Int. Cl.
*H05K 5/02* (2006.01)
*H05K 5/00* (2006.01)
*F16M 11/04* (2006.01)
*G06F 1/16* (2006.01)
*G02F 1/1333* (2006.01)

(52) U.S. Cl.
CPC .......... *H05K 5/0217* (2013.01); *F16M 11/04* (2013.01); *G02F 1/133308* (2013.01); *G06F 1/1607* (2013.01); *H05K 5/0017* (2013.01); *F16M 2200/02* (2013.01); *G06F 2200/1612* (2013.01)

(58) Field of Classification Search
CPC ....................................................... H05K 5/00
See application file for complete search history.

(56) References Cited

U.S. PATENT DOCUMENTS

| 8,164,913 B2 | 4/2012 | Hsieh et al. | |
| 2007/0166127 A1* | 7/2007 | Scroggie | F16B 21/20 411/508 |
| 2016/0259202 A1* | 9/2016 | Sugimoto | G02F 1/133308 |

FOREIGN PATENT DOCUMENTS

| CN | 102506393 A | 6/2012 | |
| CN | 103748369 A | 4/2014 | |
| CN | 107611656 A | 1/2018 | |
| CN | 207338726 U | 5/2018 | |
| JP | H07269549 A | 10/1995 | |
| WO | WO-2011053915 A1 * | 5/2011 | F16B 21/086 |

* cited by examiner

*Primary Examiner* — Jerry Wu
(74) *Attorney, Agent, or Firm* — Muncy, Geissler, Olds & Lowe, P.C.

(57) ABSTRACT

Embodiments of this application provide a connection structure and a display apparatus, where two end portions of a connection column of the connection structure are fixedly connected to a base and an elastic arm; a snap ring is sleeved over the elastic arm; and the elastic arm and the snap ring act on each other to generate a deformation to change an open/close angle between the elastic arm and the connection column.

4 Claims, 3 Drawing Sheets

100

CONNECTION STRUCTURE AND DISPLAY APPARATUS

BACKGROUND

Technical Field

This application relates to the field of display technologies, and in particular, to a connection structure and a display apparatus.

Related Art

With development of flat panel display technologies, a display effect of a flat panel display is greatly progressed. Compared with conventional cathode ray tube screens, flat panel displays have advantages such as a small weight, a small volume, and low radiation. In addition, progress in manufacturing processes and technologies reduces costs of flat panel displays, and therefore the flat panel displays are favored by a large number of consumers in the market. Common flat panel displays include Plasma Display Panels (PDPs), Liquid Crystal Displays (LCDs), Organic Light-Emitting Diodes (OLEDs), and the like. Because of advantages such as improved picture quality, a shortened response time period, relatively low costs, and a relatively long service life, the LCDs gradually become mainstream flat panel displays in the market.

In a process of manufacturing an LCD, assembly of respective modules consumes huge manpower costs. For example, respective components of an LCD are usually connected by locking screw pairs, and it is difficult to assemble or disassemble the components in a production or maintenance process, resulting in problems such as large time consumption and high production costs.

SUMMARY

This application provides a connection structure having higher convenience and a display apparatus.

According to an aspect, an embodiment of this application provides a connection structure, comprising:

a connection column, comprising two end portions, wherein a guide groove is formed between the two end portions of the connection column;

a base, fixedly connected to an end portion of the connection column;

an elastic arm, fixedly connected to an other end portion of the connection column;

a snap ring, sleeved over the elastic arm, wherein an engagement member is arranged on the snap ring, the engagement member is accommodated in the guide groove, and the engagement member moves in the guide groove under the action of an external force, to drive the snap ring to reciprocate along a direction of the guide groove; and an elastic member, wherein the elastic member is fixedly connected to a side face of the base facing the elastic arm, wherein an acting force acting on the elastic arm is generated by moving the snap ring, to enable the elastic arm to elastically deform and change an open/close angle between the elastic arm and the connection column.

According to another aspect, an embodiment of this application provides a connection structure, comprising:

a connection column, comprising two end portions, wherein a guide groove is formed between the two end portions of the connection column;

a base, fixedly connected to an end portion of the connection column;

an elastic arm, fixedly connected to an other end portion of the connection column;

a snap ring, sleeved over the elastic arm, wherein an engagement member is arranged on the snap ring, the engagement member is accommodated in the guide groove, and the engagement member moves in the guide groove under the action of an external force, to drive the snap ring to reciprocate along a direction of the guide groove; and an elastic member, fixedly connected to a side face of the base facing the elastic arm, wherein an acting force acting on the elastic arm is generated by moving the snap ring, to enable the elastic arm to elastically deform and change an open/close angle between the elastic arm and the connection column; and a clamping groove is formed on an end of the guide groove proximal to the base, and when the engagement member moves to the clamping groove, the engagement member is engaged to the clamping groove, so that a location of the snap ring is kept unchanged.

The elastic member is an elastic plate structure having a shape the same as a shape of the base, and the elastic member is conductive foam.

A quantity of the elastic arms is two, and the two elastic arms are symmetrically connected to the connection column.

According to still another aspect, an embodiment of this application provides a display apparatus, comprising a display panel, a front bezel, a back plate, and a connection structure, wherein the front bezel is fixedly connected to the back plate through the connection structure, and the connection structure comprises:

a connection column, comprising two end portions, wherein a guide groove is formed between the two end portions of the connection column;

a base, fixedly connected to an end portion of the connection column;

an elastic arm, fixedly connected to an other end portion of the connection column;

a snap ring, sleeved over the elastic arm, wherein an engagement member is arranged on the snap ring, the engagement member is accommodated in the guide groove, and the engagement member moves in the guide groove under the action of an external force, to drive the snap ring to reciprocate along a direction of the guide groove; and an elastic member, fixedly connected to a side face of the base facing the elastic arm, wherein an acting force acting on the elastic arm is generated by moving the snap ring, to enable the elastic arm to elastically deform and change an open/close angle between the elastic arm and the connection column; and a clamping groove is formed on an end of the guide groove proximal to the base, and when the engagement member moves to the clamping groove, the engagement member is engaged to the clamping groove, so that a location of the snap ring is kept unchanged.

The elastic member is an elastic plate structure having a shape the same as a shape of the base.

In the embodiments of this application, the snap ring sleeved over the elastic arm is moved to generate an acting force acting on the elastic arm, so as to rapidly change the open/close angle between the elastic arm and the connection column, thereby rapidly removing and mounting the connection structure and greatly improving working efficiency.

BRIEF DESCRIPTION OF THE DRAWINGS

To illustrate the technical solutions of the embodiments of this application more clearly, the accompanying drawings used for describing the embodiments are briefly introduced below. A person of ordinary skill in the art can derive other accompanying drawings from the accompanying drawings without creative efforts.

DETAILED DESCRIPTION

The technical solutions in the embodiments of this application are clearly and completely described below with reference to the accompanying drawings in the embodiments of this application. Apparently, the described embodiments are merely some rather than all of the embodiments of this application. All other embodiments obtained by a person of ordinary skill in the art based on the embodiments of this application without creative efforts shall fall within the protection scope of this application.

It should be understood that the terms "include" and "comprise" when used in this specification and the appended claims, specify the presence of stated features, integers, steps, operations, elements, and/or components, but do not preclude the presence or addition of one or more other features, integers, steps, operations, elements, components, and/or combinations thereof.

The following embodiments are described with reference to the accompanying drawings, and are used to exemplify particular embodiments for implementation of this application. Terms about directions mentioned in this application, such as "on", "below", "front", "back", "left", "right", "in", "out", and "side face", merely refer to directions in the accompanying drawings. Therefore, the used terms about directions are used to describe and understand this application, and are not intended to limit this application.

Figure 1:
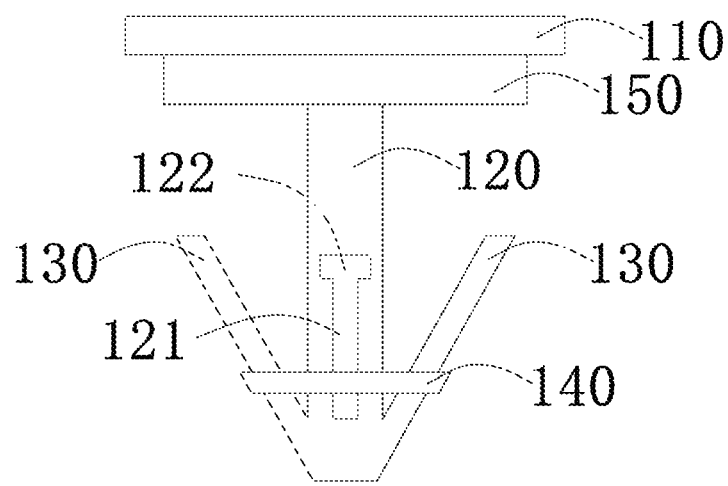
FIG. 1 is a schematic side structural view of a connection structure in an embodiment of this application.
Figure 2:
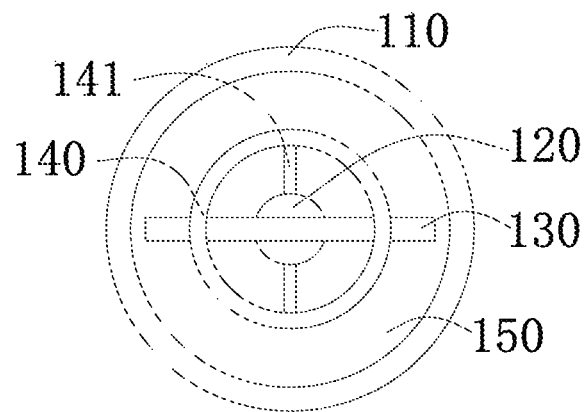
FIG. 2 is a schematic bottom structural view of a connection structure in an embodiment of this application.

FIG. 1 and FIG. 2 are a schematic side structural view and a schematic bottom structural view of a connection structure in an embodiment of this application. Specifically, the connection structure 100 includes a base 110, a connection column 120, an elastic arm 130, and a snap ring 140. The connection structure 100 may be configured to connect to a to-be-connected apparatus, the to-be-connected apparatus may include a first component and a second component, and in this case, the connection structure 100 is configured to fixedly connect the first component and the second component of the to-be-connected apparatus. Through-holes are formed on the first component and the second component, the connection structure 100 is arranged in the through-holes in a penetrating manner, and clamping forces for the first component and the second component are generated by using the base 110 and the elastic arm 130 in the connection structure 100, so as to fixedly connect the first component and the second component. The first component may be the front bezel of the display apparatus, and the second component may be the back plate of the display apparatus.

The connection column 120 includes two end portions, and a guide groove 121 is formed between the two end portions of the connection column 120.

The base 110 is fixedly connected to an end portion of the connection column 120.

The elastic arm 130 is fixedly connected to an other end portion of the connection column 120.

The snap ring 140 is sleeved over the elastic arm 130. An engagement member 141 is arranged on the snap ring 140, the engagement member 141 is accommodated in the guide groove 121, and the engagement member 141 moves in the guide groove 121 under the action of an external force, to drive the snap ring 140 to reciprocate along a direction of the guide groove 121. An acting force acting on the elastic arm 130 can be generated by moving the snap ring 140, to enable the elastic arm 130 to elastically deform and change an open/close angle between the elastic arm 130 and the connection column 120.

In a specific implementation, the guide groove 121 may be a non-through guide groove 121 or a through guide groove 121. The snap ring 140 includes an engagement member 141, and the engagement member 141 is fixedly connected to the snap ring 140. If the guide groove 121 is a through guide groove 121, the engagement member 141 runs through the guide groove 121. The engagement member 141 is arranged in the guide groove 121 in a penetrating manner. This is beneficial to enhancing a connection relationship between the guide groove 121 and the engagement member 141, to effectively prevent the engagement member 141 from falling off the guide groove 121 during moving, thereby improving overall reliability of the connection structure 100.

In a specific implementation, the base 110 may be a circular plate structure, and an end portion of the connection column 120 is fixedly connected to a circle center on a surface of the base 110. The base 110 and the connection column 120 may be combined in an integrally forming manner. Further, the connection column 120 is perpendicularly connected to the base 110. The connection column 120 is perpendicularly connected to the base, so that an area of contact between the base 110 and the to-be-connected apparatus can be increased. This is beneficial to enhancing firmness of a connection.

In a specific implementation, a quantity of the elastic arms 130 may be one or more. For example, if the quantity of the elastic arms 130 is two, the two elastic arms 130 are symmetrically connected to the connection column 120. Each elastic arm 130 includes two end portions, an end portion is connected to the elastic arm 130, and an other end portion is configured to come into contact with the to-be-connected apparatus during a use process, to generate a clamping force acting on the to-be-connected apparatus, thereby implementing connection of the to-be-connected apparatus. Further, an antiskid layer is arranged on an end of the elastic arm 130 distal to the connection column 120, and the antiskid layer may be a rubber antiskid pad. Arranging an antiskid layer on the end of the elastic arm 130 distal to the connection column 120 can increase friction between the connection structure 100 and the to-be-connected apparatus.

In some embodiments, a clamping groove 122 is formed on an end of the guide groove 121 proximal to the base 110, and when the engagement member 141 moves to the clamping groove 122, the engagement member 141 is engaged to the clamping groove 122, so that a location of the snap ring 140 is kept unchanged.

Cross sections of the clamping groove 122 and the guide groove 121 are in an L shape or a T shape. Providing a clamping groove 122 on the end of the guide groove 121 proximal to the base 110 can fix a location of the snap ring 140 to the clamping groove 122, thereby keeping an open/ close angle between the elastic arm 130 and the connection column 120 unchanged. This is beneficial to removing and mounting the connection structure 100.

Figure 3:
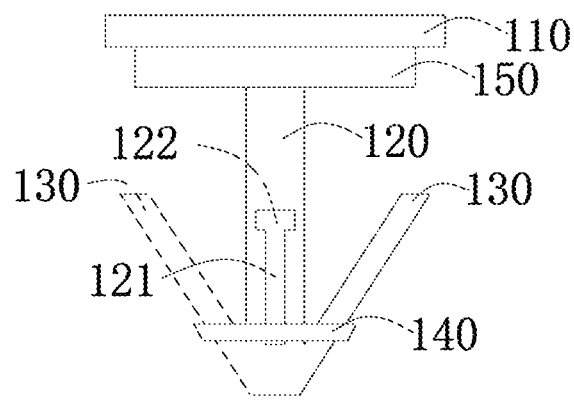
FIG. 3 is a schematic side structural view of a connection structure in an embodiment of this application.
Figure 4:
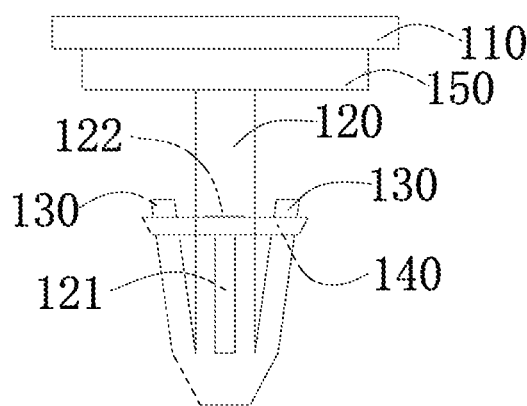
FIG. 4 is a schematic side structural view of a connection structure in an embodiment of this application.

FIG. 3 and FIG. 4 are each a schematic side structural view of a connection structure in an embodiment of this application. The snap ring 140 may generate a displacement relative to the elastic arm 130, and by means of cooperation between the engagement member 141 and the guide groove 121, can reciprocate along a direction of the guide groove 121 under the action of an external force. In a moving process of the snap ring 140, the snap ring 140 generates an acting force acting on the elastic arm 130. As a location of the snap ring 140 changes, a form of the connection structure 100 correspondingly changes.

In a specific implementation, during a process of mounting the connection structure 100, when the elastic arm 130 does not completely run through the through-holes of the to-be-connected apparatus, the snap ring 140 is subject to acting forces from the through-holes of the to-be-connected apparatus. Under the action of the acting forces, the snap ring 140 moves along the guide groove 121 toward a direction of the base 110, the snap ring 140 generates an acting force acting on the elastic arm 130, to enable the elastic arm 130 to elastically deform. In this case, the open/close angle between the elastic arm 130 and the connection column 120 is gradually decreased. When the snap ring 140 moves to the clamping groove 122, the open/close angle is in a minimum state. Hence, the connection structure 100 can quickly run through the through-holes, to be quickly mounted.

When the elastic arm 130 completely runs through the through-holes of the to-be-connected apparatus, the snap ring 140 is subject to an acting force from the elastic arm 130 and is driven to move along the guide groove 121 away from the base 110, so as to gradually increase the open/close angle between the elastic arm 130 and the connection column 120 until the snap ring 140 moves to an end of the guide groove 121 distal to the clamping groove 122. In this case, the open/close angle between the elastic arm 130 and the connection column 120 is in a maximum state. This is beneficial to quickly connecting the connection structure 100 to the to-be-connected apparatus.

In a specific implementation, during a process of removing the connection structure 100, the snap ring 140 is driven by an external force to move along the clamping groove 122 toward the base 110. In this case, the open/close angle between the elastic arm 130 and the connection column 120 is gradually decreased. When the snap ring 140 moves to the clamping groove 122, the open/close angle between the elastic arm 130 and the connection column 120 is in the minimum state. By means of an engagement relationship between the engagement member 141 and the clamping groove 122, a location of the snap ring 140 is kept unchanged, so as to keep the open/close angle unchanged, thereby implementing quick removal.

In some embodiments, the connection structure 100 further includes an elastic member 150, and the elastic member 150 is fixedly connected to a side face of the base 110 facing the elastic arm 130. Specifically, the side face of the base 110 facing the elastic arm 130 is connected to the connection column 120, and the elastic member 150 may be an elastic plate structure having a shape the same as a shape of the base 110. For example, the elastic member 150 may be conductive foam. Arranging an elastic member 150 on the base 110 can enhance overall flexibility of the connection structure 100. This is beneficial to use of the connection structure 100.

In addition, this can also prevent the to-be-connected apparatus from being damaged by the connection structure 100.

Figure 5:
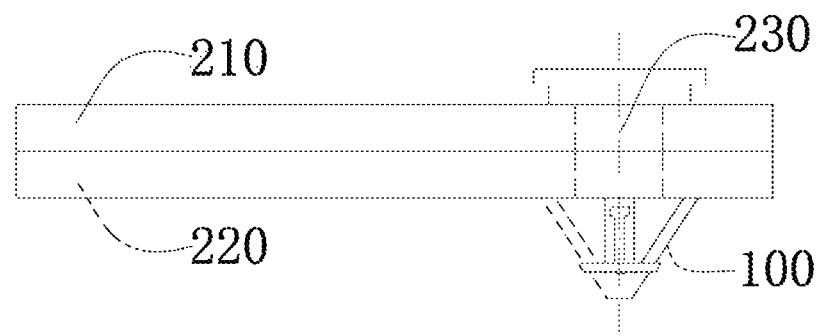
FIG. 5 is a schematic structural diagram of a display apparatus in an embodiment of this application.
Figure 6:
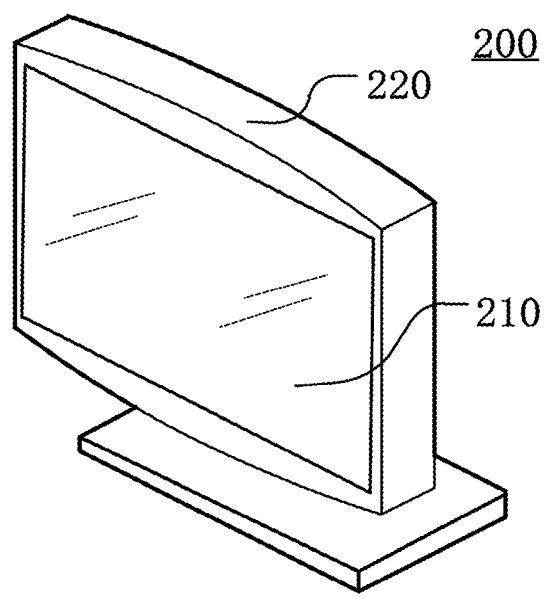
FIG. 6 is a schematic structural diagram of a display apparatus in an embodiment of this application.

FIG. 5 and FIG. 6 are each a schematic structural diagram of a display apparatus in an embodiment of this application. The display apparatus 200 includes a front bezel 210, a back plate 220, and a connection structure 100. The front bezel 210 is fixedly connected to the back plate 220 through the connection structure 100. The display apparatus 200 may further include a housing 220 and a display panel 210, the housing 220 is configured to secure the display panel 210, and accommodate the connection structure 100.

Specifically, the display panel 210 includes, but is not limited to, a Liquid Crystal Display (LCD), an Organic Light-Emitting Diode (OLED), a Field emission display (FED), a Plasma Display Panel (PDP), and a curved-surface panel. The LCD includes a Thin Film Transistor-Liquid Crystal Display (TFT-LCD), a TN panel (Twisted Nematic+ Film), a Vertical Alignment (VA) panel, an In Plane Switching (IPS) panel, a Color Filter on Array (OCA) panel, and the like.

FIG. 1 and FIG. 2 are a schematic side structural view and a schematic bottom structural view of a connection structure in an embodiment of this application. Specifically, the connection structure 100 includes a base 110, a connection column 120, an elastic arm 130, and a snap ring 140. The connection structure 100 may be configured to connect to a to-be-connected apparatus, the to-be-connected apparatus may include a first component and a second component, and in this case, the connection structure 100 is configured to fixedly connect the first component and the second component of the to-be-connected apparatus. Through-holes 230 are formed on the first component and the second component, the connection structure 100 is arranged in the through-holes 230 in a penetrating manner, and clamping forces for the first component and the second component are generated by using the base 110 and the elastic arm 130 in the connection structure 100, so as to fixedly connect the first component and the second component. The first component may be the front bezel 210 of the display apparatus 200, and the second component may be the back plate 220 of the display apparatus 200.

The connection column 120 includes two end portions, and a guide groove 121 is formed between the two end portions of the connection column 120.

The base 110 is fixedly connected to an end portion of the connection column 120.

The elastic arm 130 is fixedly connected to an other end portion of the connection column 120.

The snap ring 140 is sleeved over the elastic arm 130. An engagement member 141 is arranged on the snap ring 140, the engagement member 141 is accommodated in the guide groove 121, and the engagement member 141 moves in the guide groove 121 under the action of an external force, to drive the snap ring 140 to reciprocate along a direction of the guide groove 121. An acting force acting on the elastic arm 130 can be generated by moving the snap ring 140, to enable the elastic arm 130 to elastically deform and change an open/close angle between the elastic arm 130 and the connection column 120.

In some embodiments, through-holes 230 having a same size are formed on the front bezel 210 and the back plate 220, and the connection structure 100 is arranged in the through-holes 230 in a penetrating manner; when the engagement member 141 moves to the clamping groove 122, the engagement member 141 is engaged to the clamping groove 122, and diameters of the through-holes 230 are larger than a maximum outer diameter of the snap ring; and when the engagement member 141 is not located at the clamping groove, a maximum outer diameter of a circle formed by the elastic arm with the connection column as a circle center is larger than diameters of the through-holes 230.

In a specific implementation, the guide groove 121 may be a non-through guide groove 121 or a through guide groove 121. The snap ring 140 includes an engagement member 141, and the engagement member 141 is fixedly connected to the snap ring 140. If the guide groove 121 is a through guide groove 121, the engagement member 141 runs through the guide groove 121. The engagement member 141 is arranged in the guide groove 121 in a penetrating manner. This is beneficial to enhancing a connection relationship between the guide groove 121 and the engagement member 141, to effectively prevent the engagement member 141 from falling off the guide groove 121 during moving, thereby improving overall reliability of the connection structure 100.

In a specific implementation, the base 110 may be a circular plate structure, and an end portion of the connection column 120 is fixedly connected to a circle center on a surface of the base 110. The base 110 and the connection column 120 may be combined in an integrally forming manner. Further, the connection column 120 is perpendicularly connected to the base 110. The connection column 120 is perpendicularly connected to the base, so that an area of contact between the base 110 and the to-be-connected apparatus can be increased. This is beneficial to enhancing firmness of a connection.

In a specific implementation, a quantity of the elastic arms 130 may be one or more. For example, if the quantity of the elastic arms 130 is two, the two elastic arms 130 are symmetrically connected to the connection column 120. Each elastic arm 130 includes two end portions, an end portion is connected to the elastic arm 130, and an other end portion is configured to come into contact with the to-be-connected apparatus during a use process, to generate a clamping force acting on the to-be-connected apparatus, thereby implementing connection of the to-be-connected apparatus. Further, an antiskid layer is arranged on an end of the elastic arm 130 distal to the connection column 120, and the antiskid layer may be a rubber antiskid pad. Arranging an antiskid layer on the end of the elastic arm 130 distal to the connection column 120 can increase friction between the connection structure 100 and the to-be-connected apparatus.

Further, a clamping groove 122 is formed on an end of the guide groove 121 proximal to the base 110, and when the engagement member 141 moves to the clamping groove 122, the engagement member 141 is engaged to the clamping groove 122, so that a location of the snap ring 140 is kept unchanged.

Cross sections of the clamping groove 122 and the guide groove 121 are in an L shape or a T shape. Providing a clamping groove 122 on the end of the guide groove 121 proximal to the base 110 can fix a location of the snap ring 140 to the clamping groove 122, thereby keeping an open/close angle between the elastic arm 130 and the connection column 120 unchanged. This is beneficial to removing and mounting the connection structure 100.

FIG. 3 and FIG. 4 are each a schematic side structural view of a connection structure in an embodiment of this application. The snap ring 140 may generate a displacement relative to the elastic arm 130, and by means of cooperation between the engagement member 141 and the guide groove 121, can reciprocate along a direction of the guide groove 121 under the action of an external force. In a moving process of the snap ring 140, the snap ring 140 generates an acting force acting on the elastic arm 130. As a location of the snap ring 140 changes, a form of the connection structure 100 correspondingly changes.

In a specific implementation, during a process of mounting the connection structure 100, when the elastic arm 130 does not completely run through the through-holes 230 of the to-be-connected apparatus, the snap ring 140 is subject to acting forces from the through-holes 230 of the to-be-connected apparatus. Under the action of the acting forces, the snap ring 140 moves along the guide groove 121 toward a direction of the base 110, the snap ring 140 generates an acting force acting on the elastic arm 130, to enable the elastic arm 130 to elastically deform. In this case, the open/close angle between the elastic arm 130 and the connection column 120 is gradually decreased. When the snap ring 140 moves to the clamping groove 122, the open/close angle is in a minimum state. Hence, the connection structure 100 can quickly run through the through-holes 230, to be quickly mounted.

When the elastic arm 130 completely runs through the through-holes 230 of the to-be-connected apparatus, the snap ring 140 is subject to an acting force from the elastic arm 130 and is driven to move along the guide groove 121 away from the base 110, so as to gradually increase the open/close angle between the elastic arm 130 and the connection column 120 until the snap ring 140 moves to an end of the guide groove 121 distal to the clamping groove 122. In this case, the open/close angle between the elastic arm 130 and the connection column 120 is in a maximum state. This is beneficial to quickly connecting the connection structure 100 to the to-be-connected apparatus.

In a specific implementation, during a process of removing the connection structure 100, the snap ring 140 is driven by an external force to move along the clamping groove 122 toward the base 110. In this case, the open/close angle between the elastic arm 130 and the connection column 120 is gradually decreased. When the snap ring 140 moves to the clamping groove 122, the open/close angle between the elastic arm 130 and the connection column 120 is in the minimum state. By means of an engagement relationship between the engagement member 141 and the clamping groove 122, a location of the snap ring 140 is kept unchanged, so as to keep the open/close angle unchanged, thereby implementing quick removal.

Further, the connection structure 100 further includes an elastic member 150, and the elastic member 150 is fixedly connected to a side face of the base 110 facing the elastic arm 130. Specifically, the side face of the base 110 facing the elastic arm 130 is connected to the connection column 120, and the elastic member 150 may be an elastic plate structure having a shape the same as a shape of the base 110. For example, the elastic member 150 may be conductive foam. Arranging an elastic member 150 on the base 110 can enhance overall flexibility of the connection structure 100. This is beneficial to use of the connection structure 100. In addition, this can also prevent the to-be-connected apparatus from being damaged by the connection structure 100.

It should be noted that for simplicity of explanation, the foregoing method embodiments are all described as a combination of a series of actions, but a person skilled in the art should know that this application is not limited by the order of the actions, as some steps can, in accordance with this application, be performed in other orders or concurrently. Next, a person skilled in the art should also know that the embodiments described in the specification are all exemplary embodiments, and the related actions and modules are not necessarily required by this application.

In the embodiments, description for the embodiments has its own emphasis, and a part not described in detail in a specific embodiment can be obtained with reference to relevant descriptions in other embodiments.

The foregoing descriptions are merely specific implementations of this application, but are not intended to limit the protection scope of this application. Any equivalent amendments or replacements readily figured out by a person skilled in the art within the technical scope disclosed in this application shall all fall within the protection scope of this application. Therefore, the protection scope of this application shall be subject to the protection scope of the claims.

What is claimed is:

1. A display apparatus, comprising a display panel, a front bezel, a back plate, and a connection structure, wherein the front bezel is fixedly connected to the back plate through the connection structure, and the connection structure comprises: a connection column, comprising two end portions, wherein a guide groove is formed between the two end portions of the connection column; a base, fixedly connected to one of the two end portions of the connection column; an elastic arm, fixedly connected to the other of the two end portions of the connection column; an elastic member, fixedly connected to a side face of the base facing the elastic arm; and a snap ring, sleeved over the elastic arm, wherein an engagement member is arranged on the snap ring, the engagement member is accommodated in the guide groove, and the engagement member moves in the guide groove under an action of an external force, to drive the snap ring to reciprocate along a direction of the guide groove, wherein an acting force acting on the elastic arm is generated by moving the snap ring, to enable the elastic arm to elastically deform and change an open/close angle between the elastic arm and the connection column; and a clamping groove is formed on an end of the guide groove proximal to the base, and when the engagement member moves to the clamping groove, the engagement member is engaged to the clamping groove; and wherein through-holes having a same size are formed on the front bezel and the back plate, and the connection structure is arranged in the through-holes in a penetrating manner; wherein when the engagement member moves to the clamping groove, the engagement member is engaged to the clamping groove, and diameters of the through-holes are larger than a maximum outer diameter of the snap ring; and wherein when the engagement member is not located at the clamping groove, and a maximum outer diameter of a circle formed by the elastic arm with the connection column as a circle center is larger than diameters of the through-holes.

2. The display apparatus according to claim 1, wherein the connection column is perpendicularly connected to the base.

3. The display apparatus according to claim 1, wherein a quantity of the elastic arms is two, and the two elastic arms are symmetrically connected to the connection column.

4. The display apparatus according to claim 1, wherein the elastic member is conductive foam.

* * * * *